United States Patent [19]
Gotoda

[11] Patent Number: 5,726,473
[45] Date of Patent: Mar. 10, 1998

[54] SEMICONDUCTOR DEVICE MINIMIZING HOT CARRIER GENERATION

[75] Inventor: Ritsuko Gotoda, Hyogo, Japan

[73] Assignee: Mitsubishi Denki Kabushiki Kaisha, Tokyo, Japan

[21] Appl. No.: 664,752

[22] Filed: Jun. 17, 1996

[51] Int. Cl.⁶ .......................... H01L 29/76; H01L 29/94; H01L 31/062; H01L 31/113
[52] U.S. Cl. .............................. 257/344; 257/408
[58] Field of Search .................... 257/344, 408

[56] References Cited

U.S. PATENT DOCUMENTS 5,440,165  8/1995  Mitsunaga et al. .
5,565,700  10/1996  Chou et al. ............... 257/408

FOREIGN PATENT DOCUMENTS 6-53232  2/1994  Japan .

OTHER PUBLICATIONS

"Deep–Submicrometer Large–Angle–Tilt Implanted Drain (LATID) Technology", Hori et al., IEEE Transaction on Electron Devices, vol. 39, No. 10, Oct. 1992.

*Primary Examiner*—Wael Fahmy
*Assistant Examiner*—Howard Weiss
*Attorney, Agent, or Firm*—Lowe, Price, LeBlanc & Becker

[57] ABSTRACT

A semiconductor device has an electric field intensity profile which can suppress generation of hot carriers near a drain region. Under the conditions maximizing a substrate current, a formula (1) of $E2<E1/2$ is satisfied by a peak value (E1) in an electric field intensity profile in a channel length direction at a depth from the main surface of the semiconductor substrate allowing passage of carriers and an electric field intensity (E2) in the electric field intensity profile at an end of the gate electrode near the drain region. Generation of hot carriers near the drain can be suppressed more effectively than the case not satisfying the above conditions.

7 Claims, 7 Drawing Sheets

SEMICONDUCTOR DEVICE MINIMIZING HOT CARRIER GENERATION

BACKGROUND OF THE INVENTION

1. Field of the Invention

The present invention relates to a semiconductor device, and more particularly to a semiconductor device having a field-effect transistor.

2. Description of the Background Art

For increasing integration density of elements, it is essential to reduce sizes of the elements. In accordance with increase in an operation speed of semiconductor chips, it is now required to improve current drive capacities of elements. Required reliability of the elements is equal to or higher than that in the prior art. For improving the reliability, it is necessary to suppress generation of hot carriers during operation of the elements. In an MOS transistor, hot carriers are generated near a drain region by a strong electric field in a channel direction. In order to suppress the generation of hot carriers, therefore, it is necessary to reduce the electric field in the channel direction near the drain.

Figure 7:
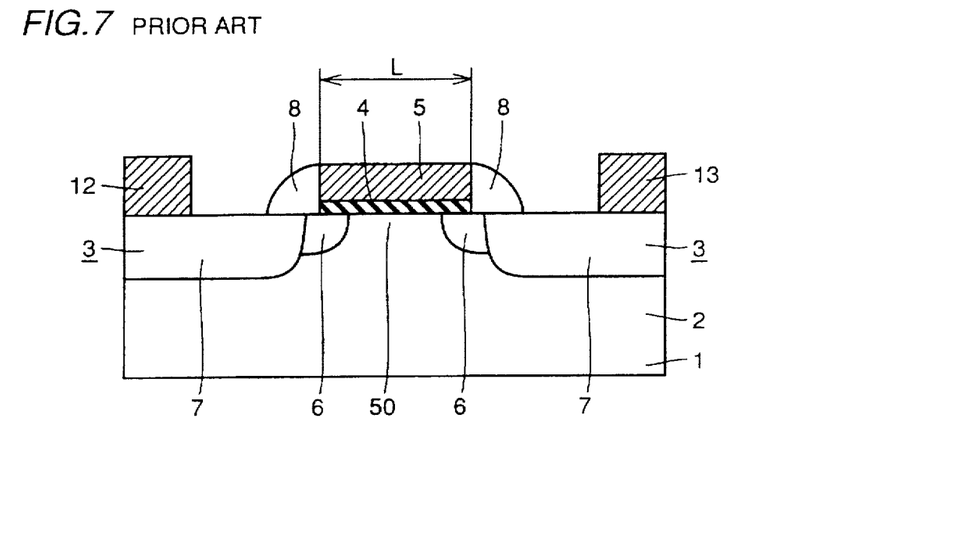
FIG. 7. is a cross section of a conventional N-channel MOS transistor.

FIG. 7 is a cross section showing a structure of a conventional N-channel MOS transistor. Referring to FIG. 7, a p-type silicon substrate 1 has an element formation region 2 at which an N-channel MOS transistor is formed. More specifically, a pair of source/drain diffusion regions 3 are formed at a main surface of element formation region 2 which are spaced from each other with a channel region 50 therebetween. Each of source/drain diffusion regions 3 has an LDD (Lightly Doped Drain) structure formed of an $n^+$ impurity region 7 and an $n^-$ impurity region 6 which is in contact with a side surface of $n^+$ impurity region 7 adjacent to channel region 50. On channel region 50, there is formed a gate electrode 5 with a gate insulating film 4 therebetween. Side surfaces of gate electrode 5 are covered with side wall insulating films 8. The impurity concentration of p-type silicon substrate 1 is $10 \times 10^{15}$ cm$^{-3}$. The impurity concentration of $n^-$ impurity diffusion region 6 is $10 \times 10^{17}$ cm$^{-3}$–$10 \times 10^{18}$ cm$^{-3}$. The impurity concentration of $n^+$ impurity diffusion region 6 is not larger than $10 \times 10^{20}$ cm$^{-3}$.

Figure 8:
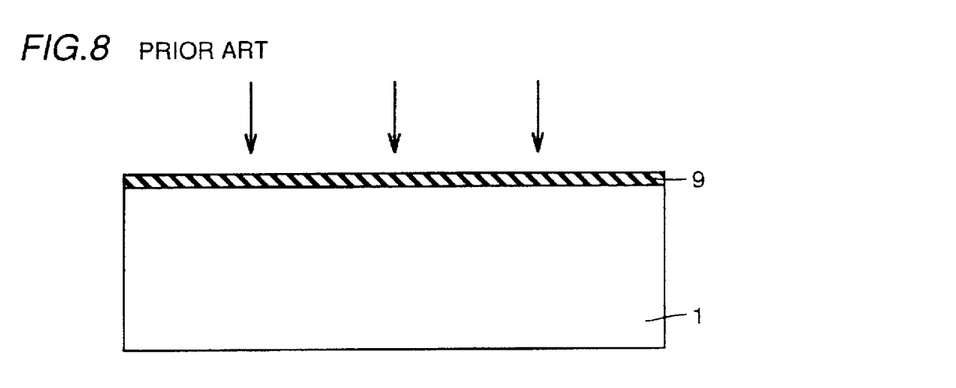
FIG. 8 to 13 are cross sections showing a process of manufacturing the conventional N-channel MOS transistor shown in FIG. 7.

Referring now to FIGS. 8 to 13, a method of manufacturing the N-channel MOS transistor shown in FIG. 7 will be described below. As shown in FIG. 8, thermal oxidation or the like is executed to form a thin silicon oxide film 9 on an exposed surface of p-type silicon substrate 1. Boron is ion-implanted into the whole surface of thin silicon oxide film 9. This ion implantation is performed for setting the threshold voltage of the N-channel MOS transistor. Thereafter, thin silicon oxide film 9 is removed with hydrogen fluoride solution.

Figure 9:
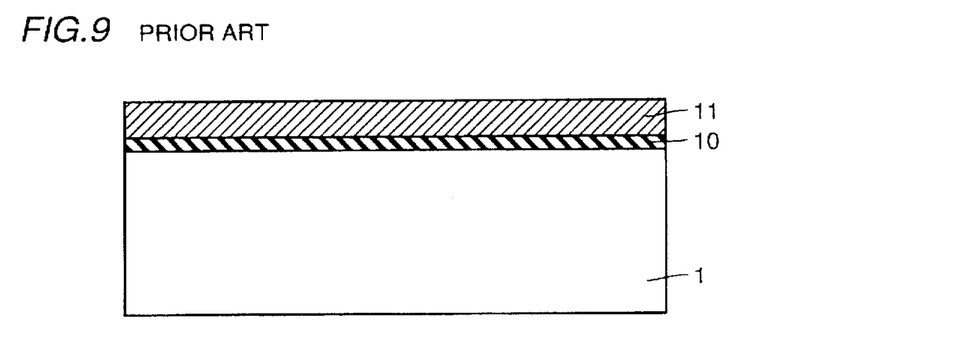

As shown in FIG. 9, a thin silicon oxide film 10 is formed on the exposed surface of p-type silicon substrate 1, e.g., by the thermal oxidation, and a polycrystalline silicon layer 11 is formed on film 10.

Figure 10:
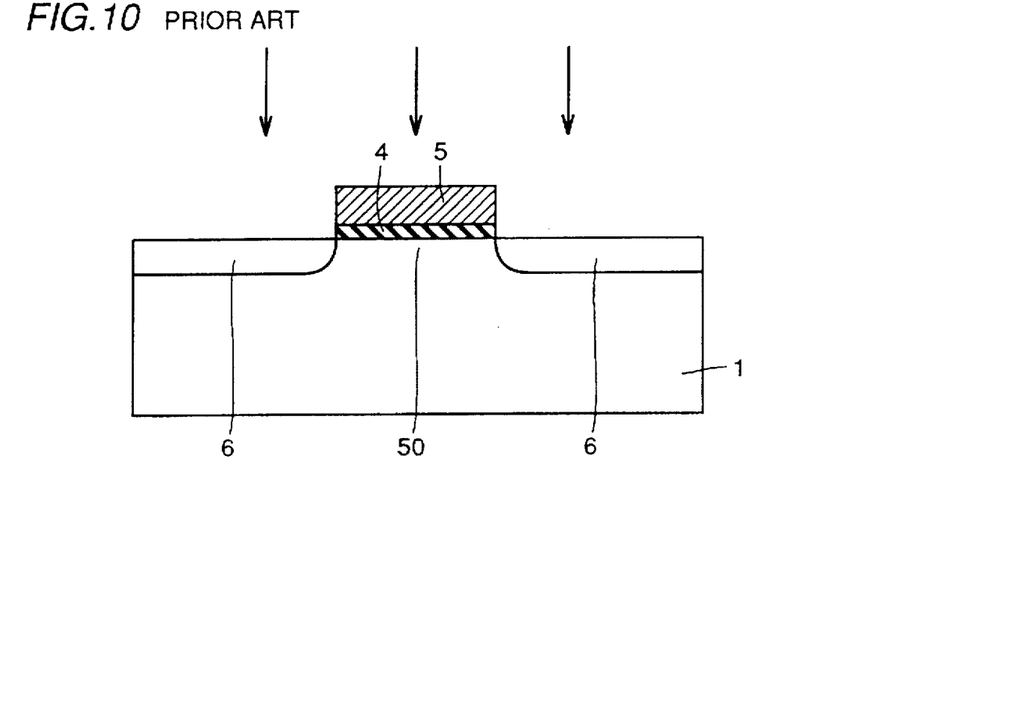

As shown in FIG. 10, polycrystalline silicon layer 11 and thin silicon oxide film 10 are patterned into predetermined configurations, e.g., by photolithography and RIE (Reactive Ion Etching) methods. Thereby, gate electrode 5 and gate insulating film 4 are formed. Then, phosphorus is ion-implanted into the whole surface of p-type silicon substrate 1 using gate electrode 5 as a mask. By this ion implantation, a pair of $n^-$ impurity diffusion regions 6 are formed at opposite sides of channel region 50 which is located under gate electrode 5.

Figure 11:
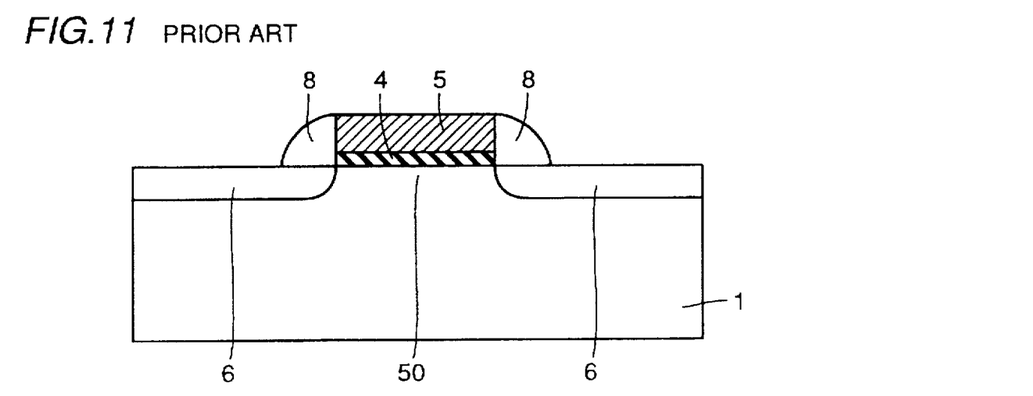

Then, a silicon oxide film (not shown) is formed on the whole surface of p-type silicon substrate 1, and subsequently is anisotropically etched to form side wall insulating films 8 covering the side surfaces of gate electrode 5 as shown in FIG. 11.

Figure 12:
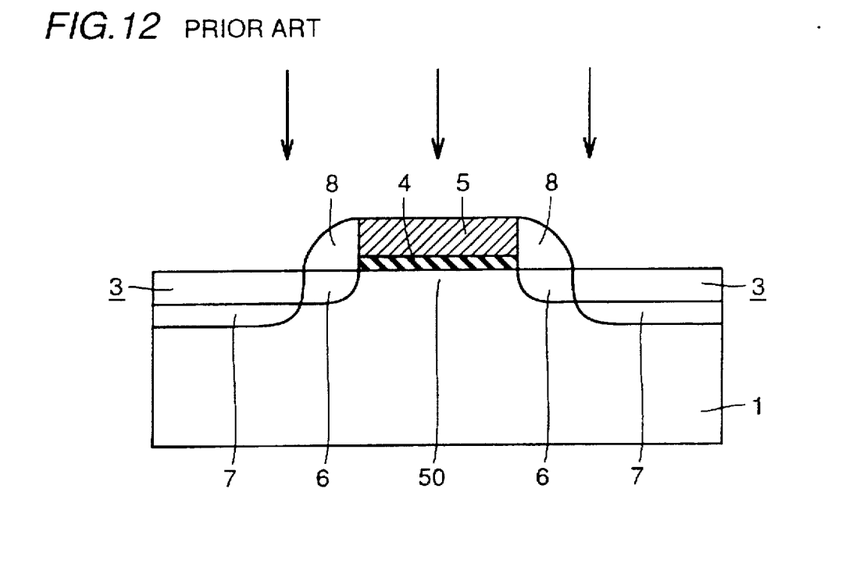
Figure 13:
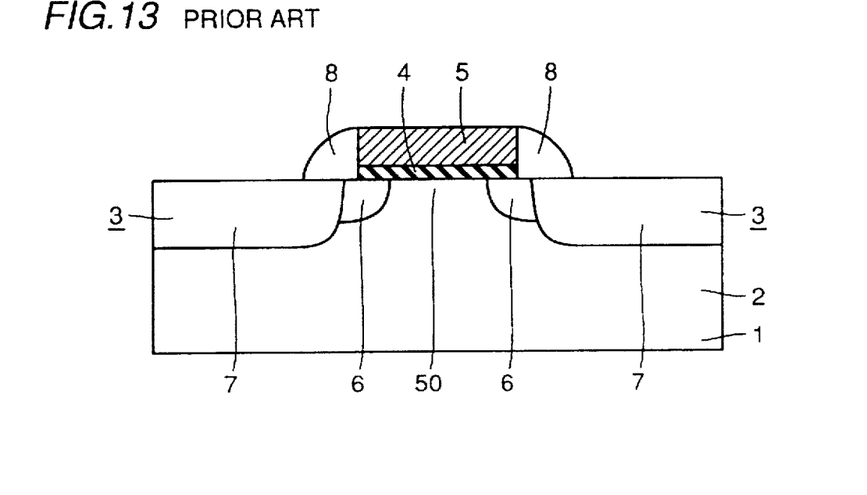

As shown in FIG. 12, arsenic is ion-implanted into the whole surface of p-type silicon substrate 1 using gate electrode 5 and side wall insulating films 8 as a mask. This ion implantation produces paired $n^+$ impurity diffusion regions 7, which are formed on the surface of silicon substrate 1 and are located at opposite sides of a region under gate electrode 5 and side wall insulating films 8. Source/drain diffusion regions 3 having the LDD structures are formed of $n^+$ and $n^-$ impurity regions 7 and 6. Thereafter, heat treatment is effected to complete source/drain diffusion regions 3 having the configuration shown in FIG. 13. After forming an interlayer insulating film (not shown) made of a silicon oxide film, openings (not shown) reaching the surfaces of source/drain diffusion regions 3 are formed at this interlayer insulating layer by the photolithography and RIE methods or the like. A polycrystalline silicon layer (not shown) is formed on the whole surface of the interlayer insulating film having the openings, and subsequently is processed by the photolithography and RIE methods or the like to form source and drain electrodes 12 and 13 shown in FIG. 7.

Figure 14:
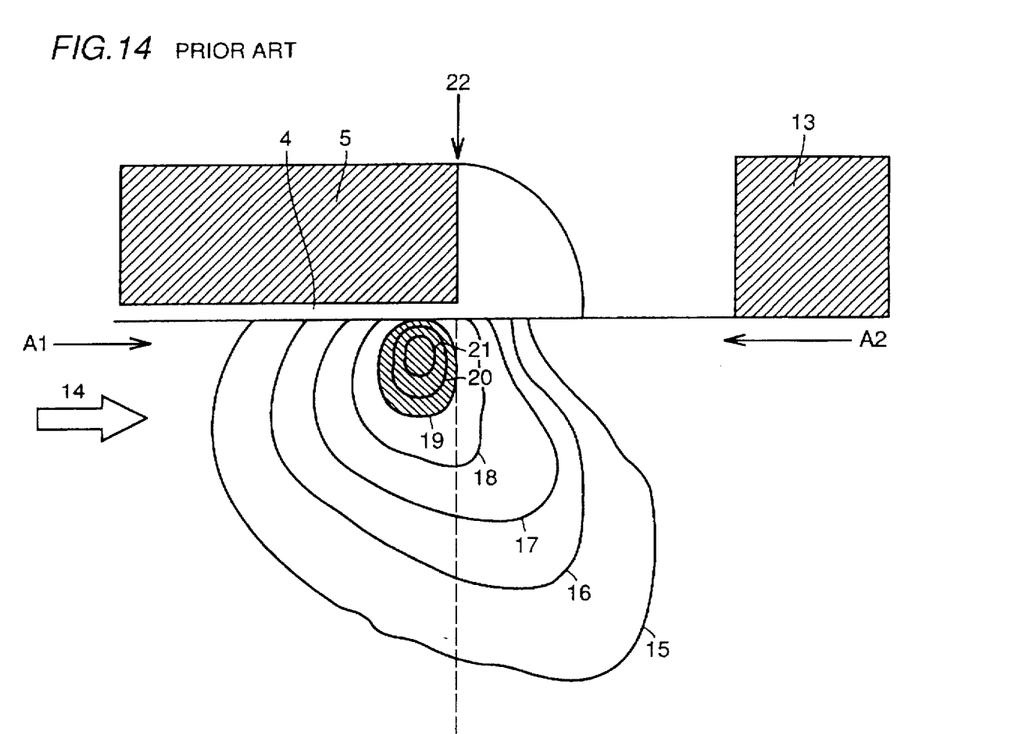
FIG. 14 shows in a two-dimensional manner an electric field intensity in a channel length direction near a drain region under a situation that hot carriers are generated in the conventional N-channel MOS transistor shown in FIG. 7.
Figure 15:
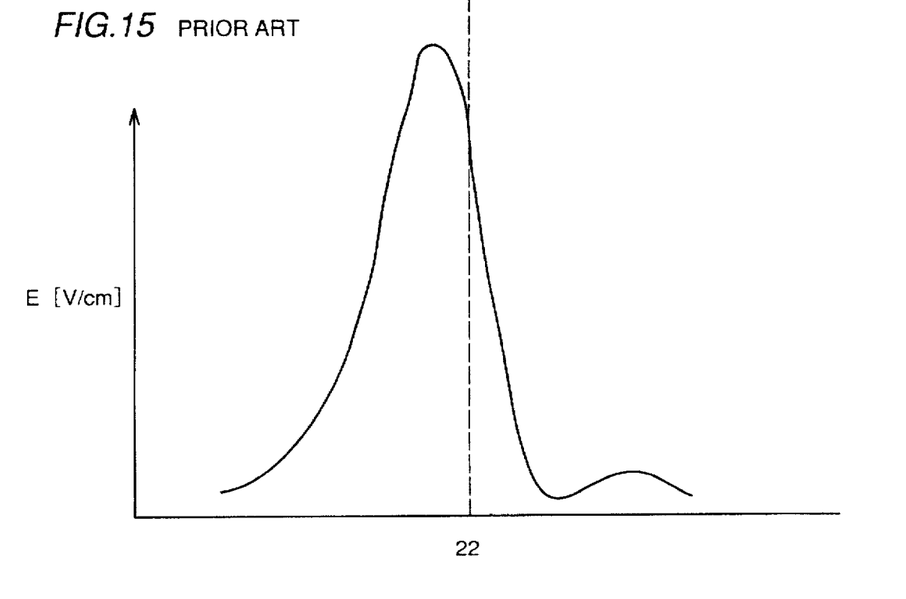
FIG. 15 shows an electric field intensity profile between A1 and A2 at a depth from a substrate surface allowing passage of hot carriers from a source.

Referring to FIGS. 14 and 15, description will be given on an electric field in the channel direction which is generated near the drain region in a situation that hot carriers are generated in the conventional structure. FIGS. 14 and 15 show a result of simulation for the electric field in the channel direction near the drain region in a situation that hot carriers are generated in the conventional N-channel MOS transistor shown in FIG. 7. The situation in which hot carriers are generated is achieved by conditions maximizing a substrate current (Isub) during operation of a transistor, and specifically such conditions that a drain voltage (Vds) is 5V, a gate voltage (Vgs) is 2.3V (40%–50% of Vds), a source voltage (Vs) is 0V and a substrate voltage (Vd) is −1.2V.

FIG. 14 shows in a two-dimensional manner an electric field in the channel direction which appears at an internal area of the silicon substrate between a portion of gate electrode 5 and drain electrode 13. The electric field in the channel direction is an electric field applied in a direction indicated by an arrow 14. This electric field accelerates carriers coming from the source diffusion region and thereby changes them into hot carriers. The intensity of electric field is represented by contours 15–21. Contour 15 represents $1 \times 10^5$ V/cm, contour 16 represents $1.5 \times 10^5$ V/cm, contour 17 represents $2 \times 10^5$ V/cm, contour 18 represents $2.5 \times 10^5$ V/cm, contour 19 represents $3 \times 10^5$ V/cm, contour 20 represents $3.5 \times 10^5$ V/cm, and contour 21 represents $4 \times 10^5$ V/cm. A region of the electric field intensity of $3 \times 10^5$ V/cm or more is hatched in the figure. Referring to FIG. 14, a peak of the electric field intensity is located at a position in the silicon substrate, which is slightly shifted into gate electrode 5 from an edge 22 of gate electrode 5 adjacent to the drain. Also, the peak in the silicon substrate is located at a depth from the silicon substrate surface, which is small and allows passage of electrons from the source region.

FIG. 15 shows the electric field intensity at a range which is defined between A1 and A2 in FIG. 14 and is located at a depth allowing passage of electrons (carriers) from the source region. As shown in FIG. 15, the profile of electric field intensity has the peak under the gate electrode, and extends up to the drain region.

In order to reduce the electric field in the channel region near the drain region, $n^+$ impurity diffusion region 7 is formed by a tilt-angle rotary implantation, and thereby n⁻ impurity diffusion region 6 is extended toward the interior of gate electrode 5 in the prior art. Thereby, it has been attempted to reduce a concentration gradient of the impurity profile at and between the source and drain regions. However, generation of hot carriers cannot be effectively suppressed only by reduction of the concentration gradient of impurity profile.

SUMMARY OF THE INVENTION

An object of the invention is to provide a semiconductor device having an electric field intensity profile which can effectively suppress generation of hot carriers.

Another object of the invention is to provide a semiconductor device having an electric field intensity profile, which has a peak at a position capable of suppressing generation of hot carriers.

According to an aspect of the invention, a semiconductor device includes a semiconductor substrate, source and drain regions, and a gate electrode. The semiconductor substrate has a main surface. The source and drains regions are formed at the main surface of the semiconductor substrate, and are spaced from each other to define a channel region therebetween. The gate electrode is formed on the channel region with a gate insulating film therebetween. The following formula (1) is satisfied, under the conditions maximizing a substrate current, by a peak value (E1) in an electric field intensity profile in a channel length direction at a depth from the main surface of the semiconductor substrate allowing passage of carriers from the source region, and an electric field intensity (E2) in said electric field intensity profile at an end of said gate electrode near said drain region:

$$E2 < E1/2 \quad (1)$$

By controlling the electric field intensity profile to satisfy the condition of the formula (1), the electric field in the channel length direction near the drain region is reduced, and thus generation of hot carriers can be effectively suppressed.

In the above semiconductor device, the peak position (x, y) of the electric field intensity in the channel length direction inside the semiconductor substrate under the conditions maximizing the substrate current during operation of a transistor may be within a range defined by the following formulas (2) and (3):

$$2Tox < x < L/2 \quad (2)$$

$$3Tox < y \quad (3)$$

where Tox represents a film thickness of the gate insulating film, L represents a gate length, x represent a distance in the channel length direction from the end of the gate electrode near the drain region to a position inside the gate electrode, and y represents a distance from an interface between the gate insulating film and the semiconductor substrate to a position inside the semiconductor substrate in a depth direction perpendicular to the above x.

In the above semiconductor device, the electric field intensity profile in the channel length direction at a depth from the main surface of the semiconductor substrate allowing passage of hot carriers from the source region may be configured to minimize a gradient (θ) viewed from the source region. This can further suppress generation of hot carriers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
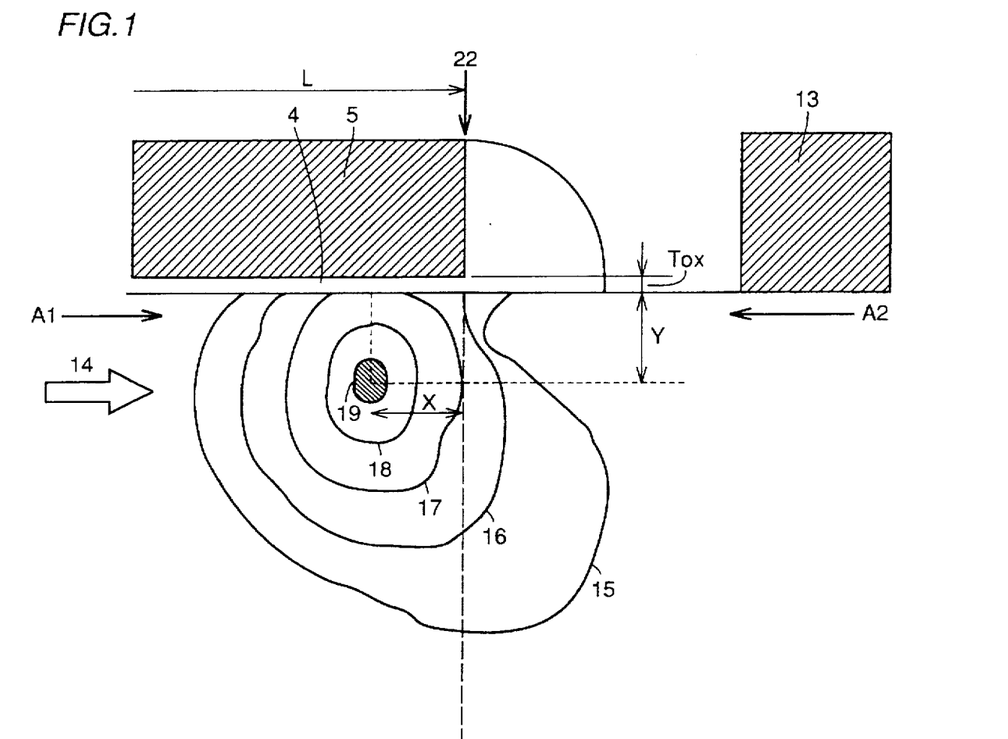
FIG. 1 shows an embodiment of the invention, and particufly shows in a two-dimensional manner an electric field in a channel length direction near a drain region under a situation that hot carriers are generated.
Figure 2:
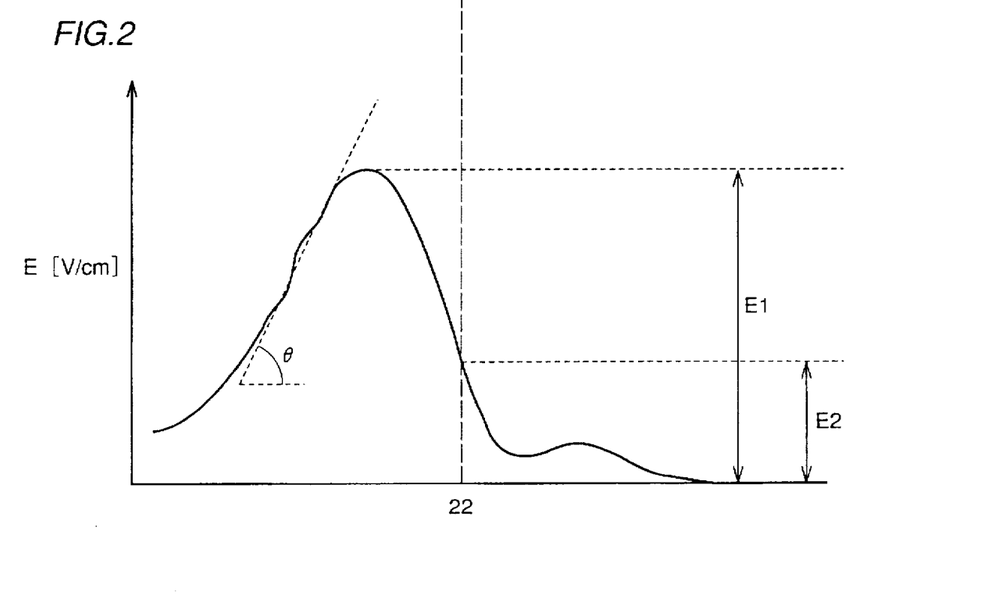
FIG. 2 shows an electric field intensity profile between A1 and A2 at a depth from a substrate surface allowing passage of hot carriers from a source.

An embodiment of the invention will be described below with reference to the drawings. Referring first to FIGS. 1 and 2, a situation in which hot carriers are generated is achieved by employing such conditions maximizing a substrate current (Isub) during operation of a transistor, and specifically such conditions that a drain voltage (Vds) is 5V, a gate voltage (Vgs) is 2.3V (40%–50% of Vds), a source voltage (Vs) is 0V and a substrate voltage (Vd) is −1.2V.

Referring to FIG. 1, the electric field in the channel direction is an electric field applied in a direction indicated by an arrow 14. This electric field accelerates carriers (electrons) coming from the source and thus changes them into hot carriers. The intensity of electric field is represented by contours 15–19. Contour 15 represents $1 \times 10^5$ V/cm, contour 16 represents $1.5 \times 10^5$ V/cm, contour 17 represents $2 \times 10^5$ V/cm, contour 18 represents $2.5 \times 10^5$ V/cm, and contour 19 represents $3 \times 10^5$ V/cm. A region of the electric field intensity of $3 \times 10^5$ V/cm or more is hatched in FIG. 1.

Referring to FIG. 2, the following formula (1) is satisfied, under the conditions maximizing the substrate current (Isub)

during operation of the transistor, by an electric field intensity in the channel direction determined at a depth (of about 10 nm to 20 nm) from the surface of the semiconductor substrate allowing passage of carriers:

$$E2 < E1/2 \tag{1}$$

wherein E1 represents a peak value of the electric field intensity in the channel direction at a small depth from the semiconductor substrate surface allowing passage of carriers (electrons) from the source, and E2 represents a value of the electric field intensity at an edge 22 of gate electrode 5 near the drain and at a small depth from the semiconductor substrate surface allowing passage of carriers (electrons) from the source. In this embodiment, the electric field intensity profile in the channel direction is controlled in this manner, so that the electric field in the channel direction near the drain can be reduced more effectively than the case where the condition (1) is not satisfied, and thus generation of hot carriers can be effectively suppressed.

In addition to the above condition (1), the peak position (x, Y) of the electric field intensity in the channel length direction inside the silicon semiconductor substrate under the conditions maximizing the substrate current (Isub) during operation of the transistor is controlled to be within a range defined by the following formulas (2) and (3):

$$3\text{Tox} < x < L/2 \tag{2}$$

$$3\text{Tox} < y \tag{3}$$

where x represent a distance in the channel length direction from edge 22 of gate electrode 22 near the drain region to the peak position inside gate electrode 5, and y represents a distance in a depth direction (i.e., direction perpendicular to the above X) from an interface between gate oxide film 4 and silicon substrate 1 to a position inside silicon substrate 1. Tox represents a film thickness of gate oxide film 4, and L represents a gate length. As can be understood from formulas (2) and 3, the electric field intensity profile of the embodiment shown in FIGS. 1 and 2 has the peak, of which position defined by x is shifted further into the interior of gate electrode 5, and of which position defined by y is at a deeper position in silicon substrate 1, as compared with the conventional electric field intensity profile shown in FIGS. 14 and 15. By adding the conditions of formulas (2) and (3) to the condition of formula (1), it is possible to provide the electric field intensity profile which can further reduce the electric field in the channel direction near the drain, and thus generation of hot carriers can be further suppressed.

Variables are selected to minimize a gradient view from the source electrode in the electric field intensity profile shown in FIG. 2, while satisfying the conditions defined by formulas (1), (2) and (3). By controlling the electric field intensity profile in this manner, the electric field in the channel direction near the drain can be reduced further effectively, and generation of hot carriers can be suppressed more effectively.

Figure 3:
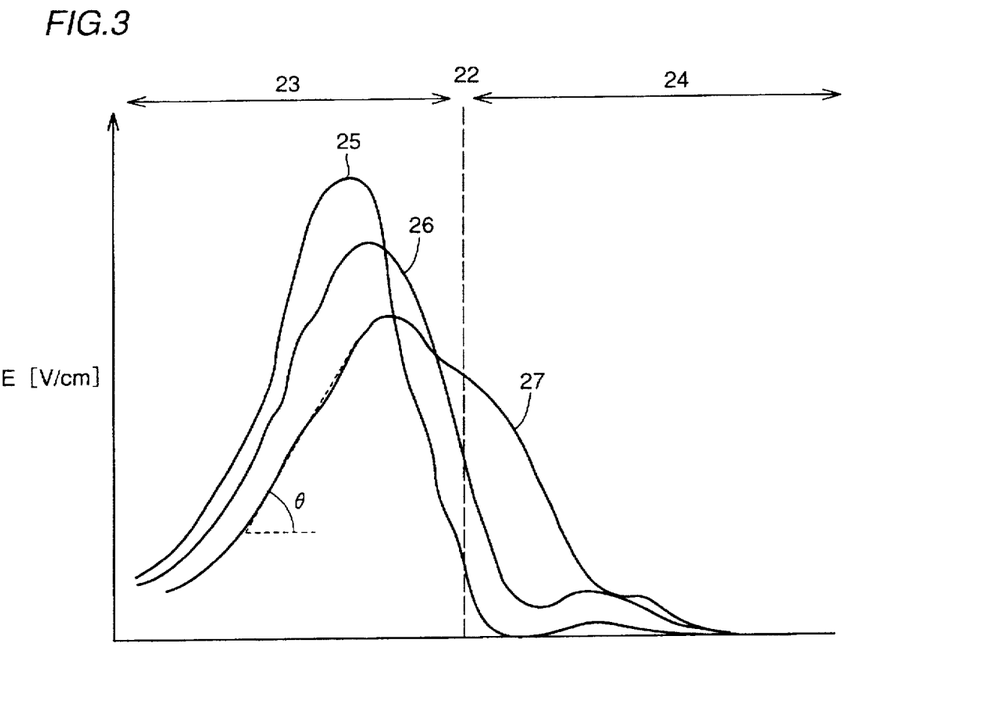
FIG. 3 shows electric field intensity profiles at a depth from the substrate surface allowing passage of hot carriers from the source, and specifically profiles corresponding to various values of a dose of impurity for forming an n⁻ impurity region according to the invention.
Figure 4:
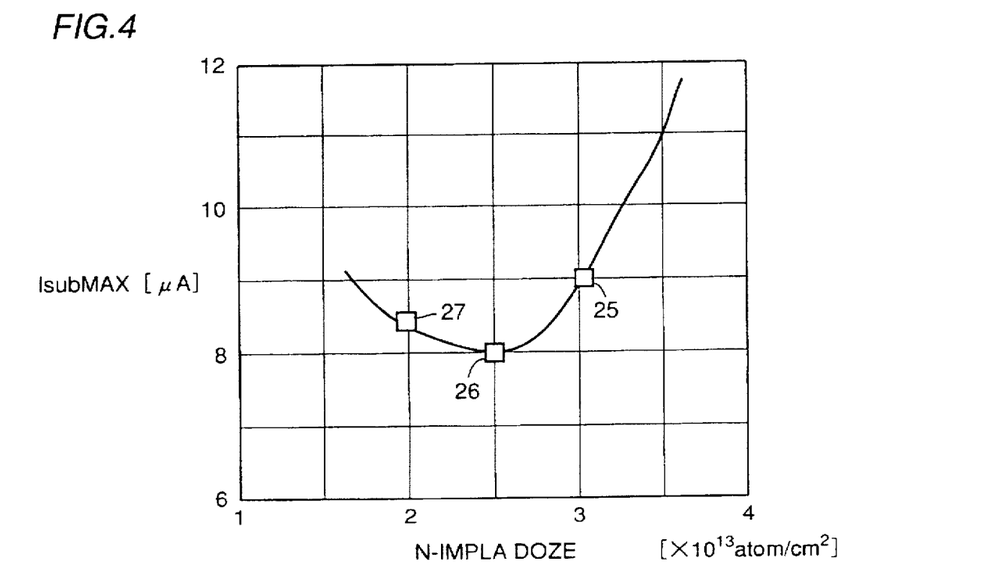
FIG. 4 shows a relationship between the substrate current and the dose corresponding to the electric field intensity profiles in FIG. 3.

Referring to FIGS. 3 and 4, description will now be given on the relationships between the electric field intensity profile and substrate current (Isub), and specifically relationships corresponding to various values of a dose in a tilt-angle rotary ion implantation for forming the $n^+$ impurity diffusion region. In this case, the electric field intensity profile means an electric field intensity profile in the channel direction at a depth from the silicon substrate surface allowing passage of carriers from the source under the situation in which hot carriers are generated in the N-channel MOS transistor structure. The substrate current (Isub) is determined by monitoring a flow of carriers, which are generated by impact-ionization caused by hot carriers, into the substrate, and has a correlation with reliability.

Referring to FIG. 3, the abscissa gives the position in the channel direction, and the ordinate gives the electric field intensity in the channel direction. Three electric field intensity profiles 25, 26 and 27 appear when the doses are $3 \times 10^{13}$ atom/cm$^2$, $2.5 \times 10^{13}$ atom/cm$^2$ and $2 \times 10^{13}$ atom/cm$^2$, respectively. It can be seen that the peak positions in the electric field intensity profiles 25–27 are in a region 23 under the gate electrode. Also, electric field intensity profiles 25–27 extend up to a drain region 24. Referring to FIG. 4, the abscissa gives the dose of ion implantation, and the ordinate gives the maximum substrate current (Isub).

Points 25–27 in FIG. 4 correspond to the electric field intensity profiles 25–27 in FIG. 3, respectively. With decrease in dose, the gradient (θ) viewed from the source electrode decreases as shown in FIG. 3, and electric field intensity profile 27 has the minimum gradient. However, electric field intensity profile 27 does not satisfy the condition defined by the formula (1) of E2<E1/2. It is electric field intensity profile 26 that satisfies the condition of formula (1) and has a small gradient (θ) viewed from the source electrode. With respect to the substrate currents in FIG. 4 corresponding to electric field intensity profiles 25–27 in FIG. 3, it can be seen that the substrate current corresponding to electric field intensity profile 26 is the smallest. As can also be seen from this, the small gradient (θ) alone cannot effectively suppress generation of hot carriers provided that the condition of the formula (1) is not satisfied.

Figure 5:
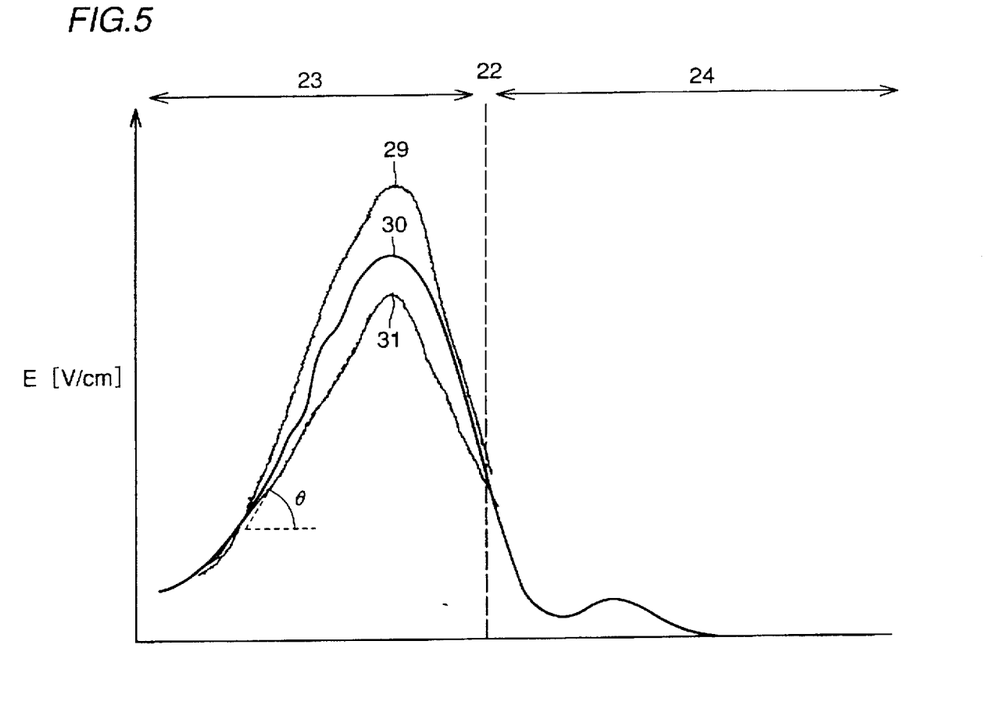
FIG. 5 shows electric field intensity profiles at a depth from the substrate surface allowing passage of hot carriers from the source, and specifically profiles corresponding to various values of an ion implantation energy for forming the n⁻ impurity region according to the invention.
Figure 6:
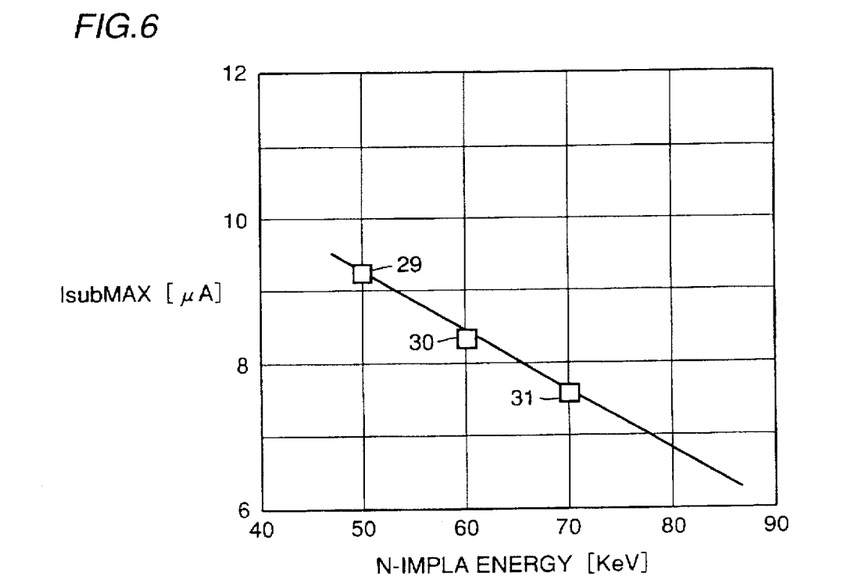
FIG. 6 shows a relationship between the substrate current and the ion implantation energy corresponding to the electric field intensity profiles in FIG. 5.

Referring to FIGS. 5 and 6, description will now be given on the relationships between the electric field intensity profile and the maximum substrate current (Isub), and specifically relationships corresponding various values of an energy in the tilt-angle rotary ion implantation for forming $n^-$ impurity diffusion region 6. Similarly to the foregoing case, the electric field intensity profile means an electric field intensity profile in the channel direction at a depth from the silicon substrate surface allowing passage of carriers from the source under the situation in which hot carriers are generated in the N-channel MOS transistor structure. Referring to FIG. 5, electric field intensity profiles 29–31 are determined when the $n^-$ impurity regions are formed by the tilt-angle rotary ion implantation with the implantation energies of 50 KeV, 60 KeV and 70 KeV, respectively. Points 29–31 in FIG. 6 correspond to electric field intensity profiles 29–31 in FIG. 5, respectively. Referring to FIG. 5, each of electric field intensity profiles 29–31 satisfies the condition defined by formula (1) of E2<E1/2. Electric field intensity profile 31 has the smallest gradient (θ) viewed from the source electrode. Referring to FIG. 6, the substrate current (Isub) attains the minimum when the energy is 70 KeV. From this, it can be understood that ion implantation with a higher energy can suppress generation of hot carriers near the drain region more effectively. However, with increase in ion implantation energy, the source/drain regions extend to regions under the gate electrode to a higher extent, which results in reduction of the effective channel length and thus enhancement of an influence by the short-channel effect. Accordingly, the implantation energy must be determined in view of transistor specifications.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a main surface;

source and drain regions formed at the main surface of said semiconductor substrate, and spaced from each other to define a channel region therebetween; and a gate electrode formed on said channel region with a gate insulating film therebetween, wherein under the conditions maximizing a substrate current, the following formula (1) is satisfied.

$$E2 < E1/2 \quad (1)$$

where (E1) represents a peak value in an electric field intensity profile in a channel length direction at a depth from the main surface of said semiconductor substrate allowing passage of carriers from said source region, and (E2) represents an electric field intensity in said electric field intensity profile at said depth from said main surface of said semiconductor substrate at an end of said gate electrode near said drain region.

2. The semiconductor device according to claim 1, wherein a peak position (x, y) of said electric field intensity in the channel length direction inside said semiconductor substrate under the conditions maximizing the substrate current during operation of a transistor is within a range defined by the following formulas (2) and (3):

$$2Tox < x < L/2 \quad (2)$$

$$3Tox < y \quad (3)$$

where Tox represents a film thickness of said gate insulating film, L represents a gate length, x represents a distance in the channel length direction from the end of said gate electrode near said drain region to a position inside said gate electrode, and y represents a distance from an interface between said gate insulating film and said semiconductor substrate to a position inside said semiconductor substrate in a depth direction perpendicular to said x.

3. The semiconductor device according to claim 1, wherein a gradient (θ) viewed from said source region is minimum in the electric field intensity profile in the channel length direction allowing passage of carriers from said source region.

4. The semiconductor device according to claim 2, wherein a gradient (θ) viewed from said source region is minimum in the electric field intensity profile in the channel length direction allowing passage of carriers from said source region.

5. The semiconductor device according to claim 1, wherein said drain region includes a heavily doped impurity region and a lightly doped impurity region being in contact with a side surface of said heavily doped impurity region near said channel region and extended to a position under said gate electrode.

6. The semiconductor device according to claim 1, wherein said depth from the main surface of said semiconductor substrate allowing passage of hot carriers is in a range from 10 nm to 30 nm.

7. The semiconductor device according to claim 1, wherein said conditions maximizing said substrate current are determined by a source voltage (Vs), a gate voltage (Vgs) and a drain voltage (Vds) of the following values:

$$Vs = 0 [V]$$

$$(0.40)Vds \leq Vgs \leq (0.50)Vds.$$

* * * * *